(12) United States Patent
Ju et al.

(10) Patent No.: US 11,756,610 B2
(45) Date of Patent: *Sep. 12, 2023

(54) APPARATUS AND METHOD WITH IN-MEMORY DELAY DEPENDENT PROCESSING

(71) Applicant: Samsung Electronics Co., Ltd., Suwon-si (KR)

(72) Inventors: Yongmin Ju, Suwon-si (KR); Sangjoon Kim, Suwon-si (KR); Hyungwoo Lee, Suwon-si (KR); Seungchul Jung, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 17/974,852

(22) Filed: Oct. 27, 2022

(65) Prior Publication Data

US 2023/0046817 A1 Feb. 16, 2023

Related U.S. Application Data

(63) Continuation of application No. 17/150,891, filed on Jan. 15, 2021, now Pat. No. 11,514,980.

(30) Foreign Application Priority Data

Jul. 3, 2020 (KR) .................. 10-2020-0082260

(51) Int. Cl.
*G11C 7/12* (2006.01)
*G11C 11/54* (2006.01)
(Continued)

(52) U.S. Cl.
CPC .......... *G11C 11/54* (2013.01); *G11C 11/4074* (2013.01); *G11C 11/4076* (2013.01);
(Continued)

(58) Field of Classification Search
CPC ... G11C 13/004; G11C 13/0028; G11C 11/54; G11C 11/4074; G11C 11/4076
See application file for complete search history.

(56) References Cited

U.S. PATENT DOCUMENTS 6,501,706 B1 12/2002 West
10,868,562 B1* 12/2020 Chou .................... H03L 7/0812
(Continued)

FOREIGN PATENT DOCUMENTS

JP 2008-227800 A 9/2008
KR 10-2019-0109173 A 9/2019
KR 10-2021-0028063 A 3/2021

*Primary Examiner* — Mushfique Siddique
(74) *Attorney, Agent, or Firm* — NSIP Law

(57) ABSTRACT

An in-memory processing apparatus includes: a memory cell array comprising memory cell groups configured to generate current sums of column currents flowing through respective column lines in response to input signals input through row lines; voltage controlled delay circuits configured to output, in response to an input of a start signal at a first time point, stop signals at second time points delayed by delay times determined based on magnitudes of applied sampling voltages corresponding to the current sums; a time-digital converter configured to perform time-digital conversion at the second time points; and sampling resistors connected to the column lines, wherein the time-digital converter is configured to reset a counter at the first time point, and output counting values as digital values at the second time points.

16 Claims, 12 Drawing Sheets

(51) Int. Cl.
*G11C 11/4074* (2006.01)
*G11C 11/4076* (2006.01)
*G11C 11/4091* (2006.01)
G11C 7/10 (2006.01)
G11C 27/02 (2006.01)

(52) U.S. Cl.
CPC ........ *G11C 11/4091* (2013.01); *G11C 7/1006* (2013.01); *G11C 27/02* (2013.01)

(56) References Cited

U.S. PATENT DOCUMENTS

| | | | |
|---|---|---|---|
| 11,012,083 B1* | 5/2021 | Waltari | G04F 10/005 |
| 2007/0096836 A1* | 5/2007 | Lee | H03L 7/085 |
| | | | 331/57 |
| 2010/0328130 A1* | 12/2010 | Bulzacchelli | H03M 1/20 |
| | | | 341/166 |
| 2013/0100069 A1* | 4/2013 | Kwon | G06F 3/0446 |
| | | | 345/174 |
| 2017/0364793 A1* | 12/2017 | Kim | G11C 13/0004 |
| 2018/0232635 A1* | 8/2018 | Oh | G06F 5/01 |
| 2019/0042160 A1 | 2/2019 | Kumar et al. | |
| 2019/0114141 A1 | 4/2019 | Buchanan et al. | |
| 2019/0362787 A1 | 11/2019 | Lu et al. | |
| 2021/0064367 A1* | 3/2021 | Kim | G06F 9/3001 |
| 2021/0366542 A1 | 11/2021 | Lee et al. | |
| 2021/0405967 A1 | 12/2021 | Jung et al. | |
| 2022/0082602 A1* | 3/2022 | Chou | H03L 7/0812 |

\* cited by examiner

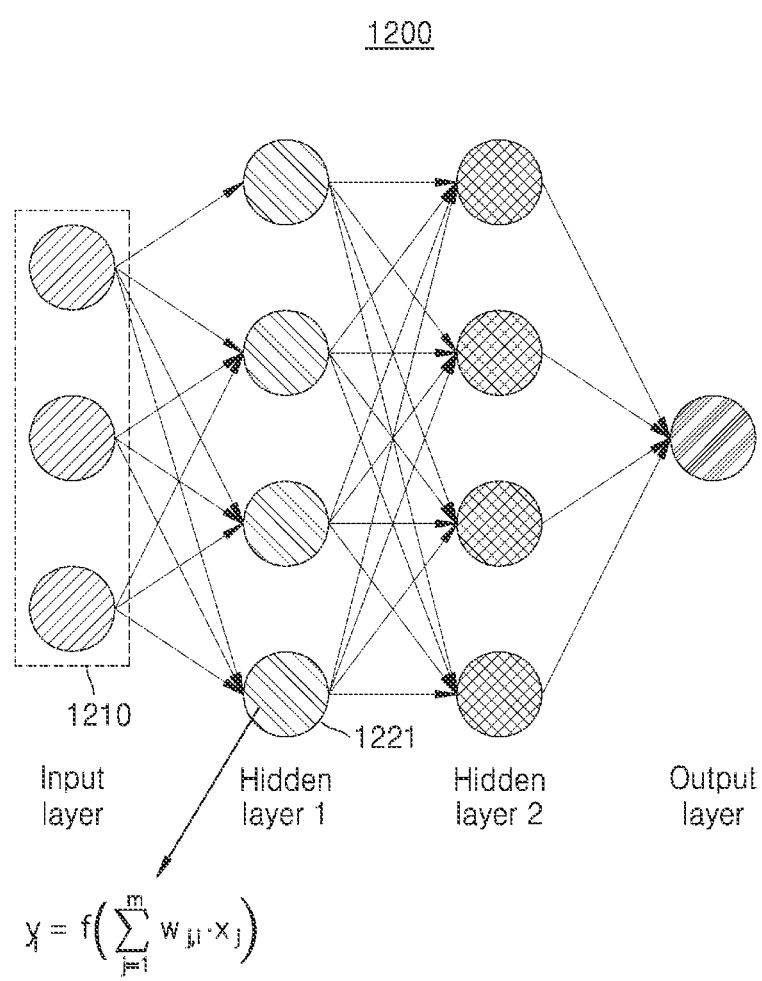

APPARATUS AND METHOD WITH IN-MEMORY DELAY DEPENDENT PROCESSING

CROSS-REFERENCE TO RELATED APPLICATION

This application is a Continuation Application of U.S. patent application Ser. No. 17/150,891 filed on Jan. 15, 2021, which claims the benefit under 35 U.S.C. § 119(a) of Korean Patent Application No. 10-2020-0082260, filed on Jul. 3, 2020, in the Korean Intellectual Property Office, the entire disclosure of which is incorporated herein by reference for all purposes.

BACKGROUND

1. Field

The following description relates to an apparatus with in-memory processing and a computing apparatus including the same.

2. Description of Related Art

A neural network may be a computing system implemented with reference to a computational architecture. Input data may be analyzed and valid information may be extracted using neural networks in various types of electronic systems. Processing in neural networks may require a large amount of computations on complex input data. As the data of a neural network increases and the connectivity of the architecture constituting the neural network becomes complicated, the amount of computations and the frequency of memory access in a processing apparatuses may increase excessively, and as a result, miniaturization and commercialization of processing apparatuses may be inefficient. For example, processing of the neural network may include a multiply-accumulate (MAC) operation that repeats multiplication and addition. However, hardware architecture and hardware driving methods may not efficiently process repetitive MAC operations that take up a large amount of computations in the processing of neural networks at low power and high speed.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In one general aspect, an in-memory processing apparatus includes: a memory cell array comprising memory cell groups configured to generate current sums of column currents flowing through respective column lines in response to input signals input through row lines; voltage controlled delay circuits configured to output, in response to an input of a start signal at a first time point, stop signals at second time points delayed by delay times determined based on magnitudes of applied sampling voltages corresponding to the current sums; and a time-digital converter configured to perform time-digital conversion at the second time points.

The voltage controlled delay circuits may be configured to determine the delay times in proportion to the magnitudes of the sampling voltages.

The voltage controlled delay circuits may be current-starved types including transistors to which the sampling voltages is are applied and inverters to which the start signal is input.

The voltage controlled delay circuits may include biases connected to the column lines and configured to apply the sampling voltages, current-starved delay elements to which the start signals are input, and buffers configured to output the stop signals.

The may include sampling resistors connected to the column lines, wherein the sampling voltages are applied to the sampling resistors.

The sampling resistors may be connected in series to the column lines, and the voltage controlled delay circuits may be connected in parallel to the sampling resistors.

Values of the sampling voltages may be determined based on composite resistances of resistance values of the memory cell groups and resistance values of the sampling resistors.

The apparatus may include a driver configured to input the input signals to the memory cell array at a third time point synchronized with the first time point.

The time-digital converter may be configured to reset a counter at the first time point, and output counting values as digital values at the second time points.

The time-digital converter may include an oscillator configured to generate a pulse at the first time point and the counter configured to count the pulse.

The time-digital converter may include flip-flops configured to latch the counting values at the second time point.

In another general aspect, a computing apparatus includes: a host processor; a memory device; and an in-memory processing device comprising: a memory cell array comprising memory cell groups configured to generate current sums of column currents flowing through respective column lines in response to input signals input through row lines; voltage controlled delay circuits configured to output, in response to an input of a start signal at a first time point, stop signals at second time points delayed by delay times determined based on magnitudes of applied sampling voltages corresponding to the current sums; and a time-digital converter configured to perform time-digital conversion at the second time points.

The voltage controlled delay circuits may be configured to determine the delay times in proportion to the magnitudes of the sampling voltages.

The voltage controlled delay circuits may be current-starved types including transistors to which the sampling voltages are input and inverters to which the start signal is input.

The voltage controlled delay circuits may include biases connected to the column lines and configured to apply the sampling voltages, current-starved delay elements to which the start signals are input, and buffers configured to output the stop signals.

The in-memory processing device may include sampling resistors connected to the column lines, wherein the sampling voltages are applied to the sampling resistors.

The time-digital converter may be configured to reset a counter at the first time point, and output counting values as digital values at the second time points.

The memory device may store instructions that, when executed by the host processor, configure the host processor to control the in-memory processing device to perform the generating of the current sums, the outputting of the stop signals, and the performing of the time-digital conversion.

In another general aspect, an in-memory processing method includes: inputting input signals to memory cell groups through row lines of a memory cell array; applying sampling voltages corresponding to current sums of column currents flowing through column lines of the memory cell array to voltage controlled delay circuits connected to the column lines; inputting a start signal to the voltage controlled delay circuits at a first time point; outputting stop signals at second time points delayed by delay times determined based on magnitudes of the sampling voltages; and performing time-digital conversion at the second time points.

Sampling resistors may be connected to the column lines, and the method may include determining the sampling voltages based on composite resistances of resistance values of the memory cell groups and resistance values of the sampling resistors.

The method may include resetting a counter at the first time point, and outputting counting values as digital values at the second time points.

The method may include outputting, based on the output counting values, an output digital value corresponding to a MAC operation result of a neural network.

In another general aspect, an in-memory processing apparatus includes: a memory cell array comprising memory cell groups each corresponding to a respective column line and configured to generate a current sum of column currents flowing through the respective column line in response to input signals applied through row lines; voltage controlled delay circuits each corresponding to a respective column line and configured to output, in response to an input of a start signal at a first time point, a stop signal at second time point delayed by a delay time determined based on a magnitude of an applied sampling voltage corresponding to a respective one of the current sums; and a time-digital converter configured to, based on the stop signals, perform time-digital conversion at the second time points.

The time-digital converter may include: an oscillator configured to generate a counting pulse starting from the first time point, in response to receiving the start signal; a counter configured to generate counting values of the counting pulse in response to the generating of the counting pulse; and flip-flops each corresponding to a respective column line and configured to output a counting value of the generated counting values corresponding to a respective second time point, in response to receiving a stop signal of the stop signals from a respective one of the voltage controlled delay circuits.

Other features and aspects will be apparent from the following detailed description, the drawings, and the claims.

BRIEF DESCRIPTION OF THE DRAWINGS

FIG. 12 illustrates an example of a neural network.

DETAILED DESCRIPTION

Figure 1:
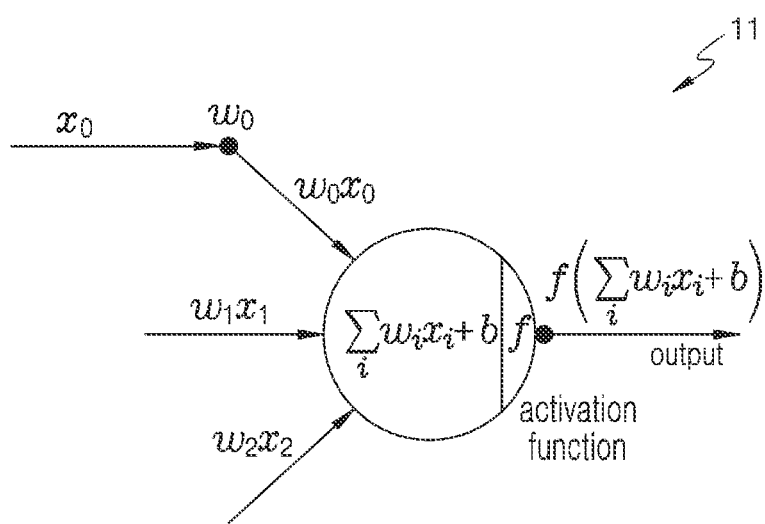
FIG. 1 illustrates an example of a neural network node model.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art, after an understanding of the disclosure of this application, may be omitted for increased clarity and conciseness.

Reference will now be made in detail to embodiments, examples of which are illustrated in the accompanying drawings, wherein like reference numerals refer to like elements throughout. In this regard, the one or more embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Unless otherwise defined, all terms, including technical and scientific terms, used herein have the same meaning as commonly understood by one of ordinary skill in the art to which this disclosure pertains and after an understanding of the disclosure of this application. Terms, such as those defined in commonly used dictionaries, are to be interpreted as having a meaning that is consistent with their meaning in the context of the relevant art and the disclosure of this application, and are not to be interpreted in an idealized or overly formal sense unless expressly so defined herein.

The terminology used herein is for the purpose of describing particular examples only, and is not to be used to limit the disclosure. As used herein, the singular forms "a," "an," and "the" are intended to include the plural forms as well, unless the context clearly indicates otherwise. As used herein, the term "and/or" includes any one and any combination of any two or more of the associated listed items. As used herein, the terms "include," "comprise," and "have" specify the presence of stated features, numbers, operations, elements, components, and/or combinations thereof, but do not preclude the presence or addition of one or more other features, numbers, operations, elements, components, and/or combinations thereof. The use of the term "may" herein with respect to an example or embodiment (for example, as to what an example or embodiment may include or implement) means that at least one example or embodiment exists where such a feature is included or implemented, while all examples are not limited thereto.

Hereinafter, embodiments will be described in detail with reference to the accompanying drawings. However, the embodiments may be implemented in many different forms and should not be construed as being limited to the embodiments set forth herein.

FIG. 1 illustrates an example of a neural network node model.

The neural network node model 11 may implement a neuromorphic operation including a multiplication operation that multiplies information from a plurality of neurons by a synaptic weight, an addition operation $\Sigma$ on values $\omega_0 x_0$, $\omega_1 x_1$, and $\omega_2 x_2$ multiplied by the synaptic weight, and an operation that applies the characteristic function b and the activation function f to the result of the addition operation. Neuromorphic operation results may be provided by the neuromorphic operation. Here, values such as $x_0$, $x_1$, $x_2$, . . . may be referred to as axon values, and values such as $\omega_0$, $\omega_1$, $\omega_2$, . . . may be referred to as synaptic weights. While the nodes, values, and weights of the neural network node model 11 may be respectively referred to as "neurons," "axon values," and "synaptic weights," such reference is not intended to impart any relatedness with respect to how the neural network architecture computationally maps or thereby intuitively recognizes information and how a human's neurons operate. I.e., the terms are merely terms of art referring to the hardware implemented nodes, values, and weights of the neural network node model 11.

Figure 2:
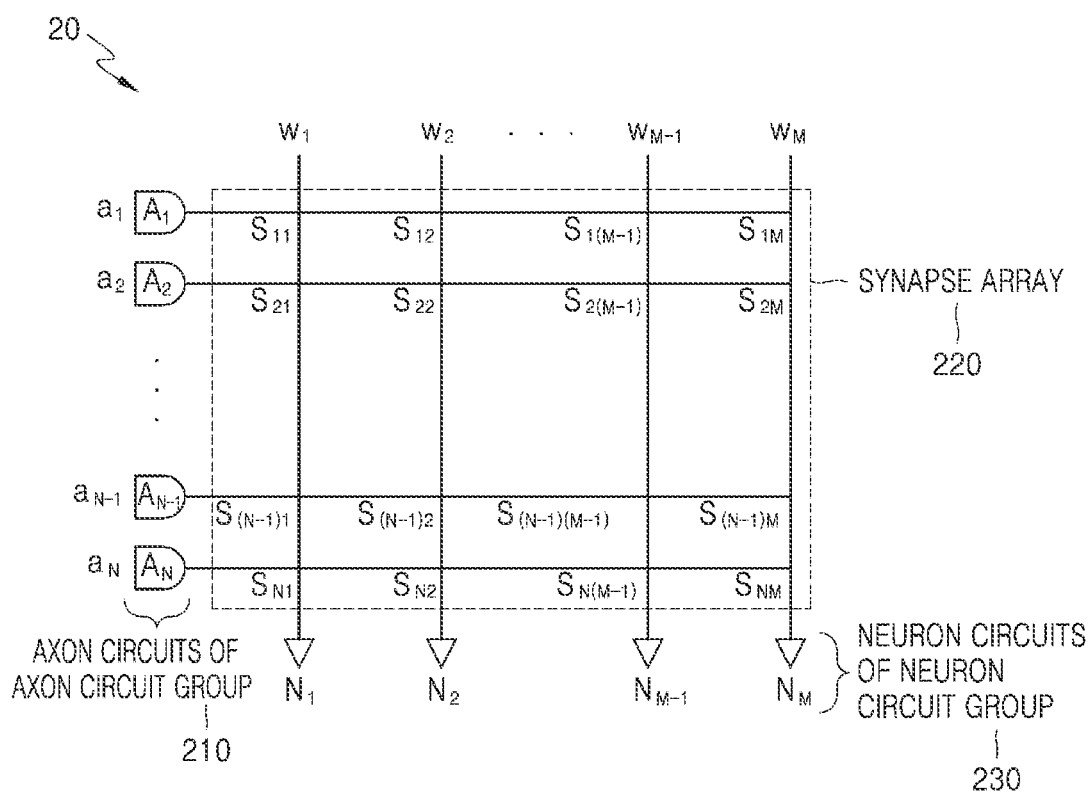
FIG. 2 illustrates an example of a two-dimensional array circuit for performing a neuromorphic operation.

FIG. 2 illustrates an example of a two-dimensional array circuit (e.g., a two-dimensional array circuit 20) for performing a neuromorphic operation.

Referring to FIG. 2, the two-dimensional array circuit 20 may include an axon circuit group 210 including N axon circuits $A_1$ to $A_N$, a neuron circuit group 230 including M neuron circuits $N_1$ to $N_M$, and a synapse array 220 including N*M synapses $S_{11}$ to $S_{NM}$, wherein N and M are arbitrary natural numbers, respectively. While the circuits and arrays may be referred to as "axon circuits," "neuron circuits" and/or "synapse arrays," such terms are merely terms of art referring to the hardware-implemented array circuit.

Each of the synapses $S_{11}$ to $S_{NM}$ of the synapse array 220 may be arranged at intersections where the first direction lines extending in a first direction from the axon circuits $A_1$ to $A_N$ of the axon circuit group 210 intersect with the second direction lines extending in a second direction from the neuron circuits $N_1$ to $N_M$ of the neuron circuit group 230. Here, for convenience of description, it is illustrated that the first direction is a row direction and the second direction is a column direction, but the present disclosure is not limited thereto. For example, the first direction may be the column direction, and the second direction may be the row direction.

Each of the axon circuits $A_1$ to $A_N$ of the axon circuit group 210 may receive (for example, each of axons $a_1, a_2, \ldots, a_N$) to transmit an activation to the first direction lines. The activation may correspond an electrical signal input to each of the axon circuits $A_1$ to $A_N$ of the axon circuit group 210. Each of the axon circuits $A_1$ to $A_N$ of the axon circuit group 210 may include a memory, a register, or a buffer for storing input information. Meanwhile, the activation may be a binary activation having a binary value. For example, the binary activation may include 1-bit information corresponding to the logical value "0" or "1" (or logical value "−1" or "1"). However, the activation is not limited thereto and may have a ternary value or a multi-bit value.

Each of the synapses $S_{11}$ to $S_{NM}$ of the synapse array 220 may be a circuit that stores synaptic weights (e.g., such as that of the neural network node model 11 of FIG. 1) corresponding to interconnection intensity between a neuron and another neuron. In FIG. 2, for convenience of description, $w_1, w_2, \ldots, w_M$ are illustrated as examples of synaptic weights to be stored in each synapse, but other synaptic weights may be stored in each synapse. Each of the synapses $S_{11}$ to $S_{NM}$ of the synapse array 220 may include a memory device for storing synaptic weights or may be connected to another memory device that stores synaptic weights. Here, such a memory device may include, for example, a memristor or a resistive memory cell. The memristor or resistive memory cell may be implemented with static random-access memory (SRAM), phase change memory (PCM), oxide based memory (OXRAM), magnetoresistive random-access memory(MRAM), spin-transfer torque random-access memory (STT-RAM), conductive-bridge random-access memory (CBRAM), resistive RAM (RRAM), ferroelectric RAM (FRAM), a magnetic tunnel junction (MTJ) device, etc., but is not limited thereto.

Each of the synapses $S_{11}$ to $S_{NM}$ of the synapse array 220 may receive the activation input transmitted from each of the axon circuits $A_1$ to $A_N$ of the axon circuit group 210 through the corresponding first direction line and may output a result of a neuromorphic operation between the stored synaptic weight and the activation input. For example, the neuromorphic operation between the synaptic weight and the activation input may be a multiplication operation (i.e., an AND operation), but is not limited thereto. That is, the result of the neuromorphic operation between the synaptic weight and the activation input may be a value obtained by another arbitrary appropriate operation to simulate the intensity or magnitude of the activation adjusted according to the interconnection intensity between a neuron and another neuron.

According to the neuromorphic operation between the synaptic weight and the activation input, the magnitude or intensity of signals transmitted from the axon circuits $A_1$ to $A_N$ of the axon circuit group 210 to the neuron circuits $N_1$ to $N_M$ of the neuron circuit group 230 may be adjusted. In this way, an operation in which the magnitude or intensity of the signal transmitted to the next neuron is adjusted according to the intensity of the interconnection between a neuron and another neuron may be simulated using the synapses $S_{11}$ to $S_{NM}$ of the synapse array 220.

Each of the neuron circuits $N_1$ to $N_M$ of the neuron circuit group 230 may receive the result of a neuromorphic operation between the synaptic weight and the activation input through the corresponding second direction line. Each of the neuron circuits $N_1$ to $N_M$ of the neuron circuit group 230 may determine whether to output a spike based on the result of the neuromorphic operation. For example, each of the neuron circuits $N_1$ to $N_M$ may output a spike when the accumulated value of the neuromorphic operation results is equal to or greater than a preset threshold. The spikes output from the neuron circuits $N_1$ to $N_M$ of the neuron circuit group 230 may correspond to activations to be input to axon circuits of a next step.

Meanwhile, the neuron circuits $N_1$ to $N_M$ of the neuron circuit group 230 are located in the next step based on the synapses $S_{11}$ to $S_{NM}$ of the synapse array 220 and thus may be referred to as post-synaptic neuron circuits, and the axon circuits $A_1$ to $A_N$ of the axon circuit group 210 are located in the previous step based on synapses $S_{11}$ to $S_{NM}$ of the synapse array 220 and thus may be referred to as pre-synaptic neuron circuits.

Figure 3:
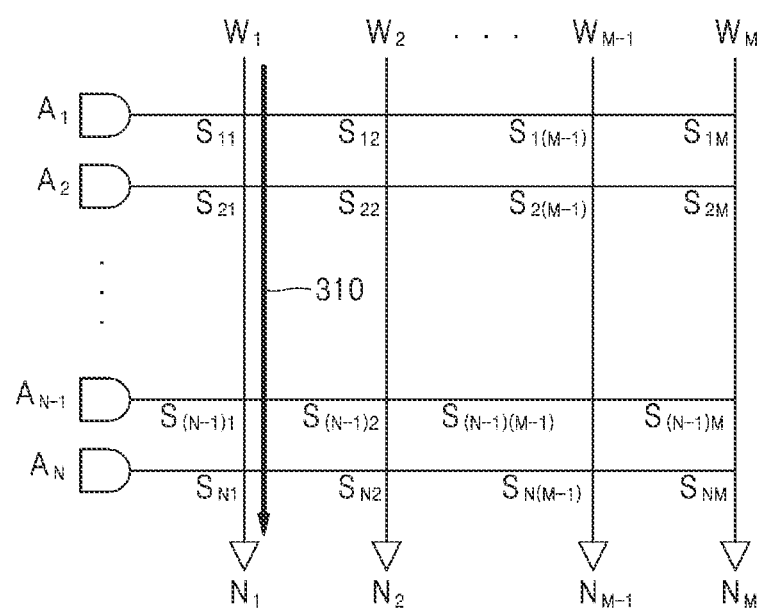
FIG. 3 illustrates an example of a method of processing a neuromorphic operation.

FIG. 3 illustrates an example of a method of processing a neuromorphic operation in an in-memory processing device.

A two-dimensional array circuit for processing neuromorphic operations may use a current summation method for each column line. For example, the two-dimensional array circuit may sum the currents flowing along the column line 310 through synapses $S_{11}$, $S_{21}$, $S_{(N-1)1}$, and $S_{N1}$ by activations transmitted from axon circuits $A_1$ to $A_N$, and outputs a spike when the magnitude or intensity of the summed current is greater than or equal to a preset threshold. At this time, as the spike output is quantized into a digital signal and then applied as an activation input to be input to the axon circuits of a next step, a peripheral circuit such as an analog to digital converter (ADC) may be used. However, when independent ADCs are provided in all columns as in a conventional in-memory processing device, power consumption increases and a large area is required in the circuit. In contrast, for a neuromorphic operation such as a MAC operation that repeats addition and multiplication, an in-memory processing device of one or more embodiments may include a single highly integrated on-chip system having a circuit design based on a single time-digital converter (TDC), without configuring individual ADCs in columns as in the conventional in-memory processing device. Hereinafter, a non-limiting example method of implementing the above system will be described.

Figure 4:
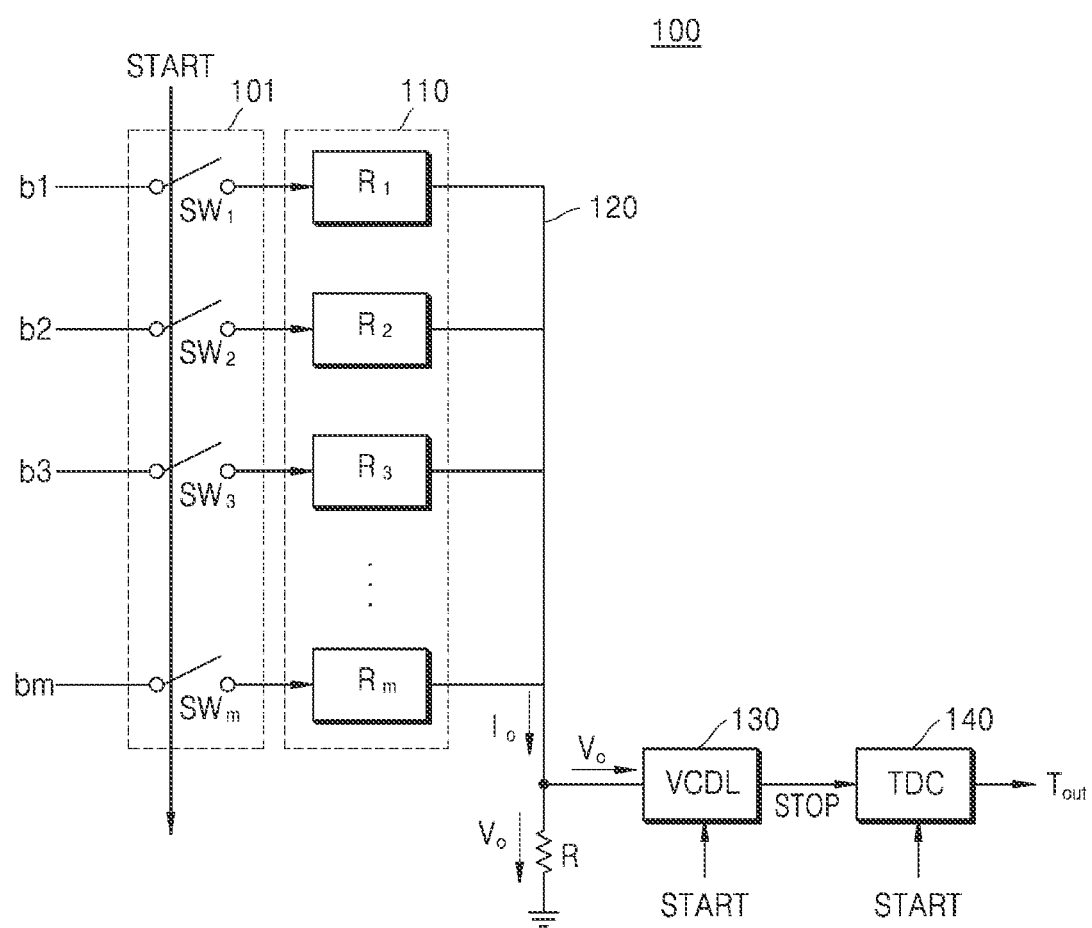
FIG. 4 illustrates an example of an in-memory processing device.

FIG. 4 illustrates an example of an in-memory processing device (e.g., an in-memory processing device 100).

Referring to FIG. 4, the in-memory processing device 100 may be configured as a circuit that outputs a result of performing multiplication and addition for a neuromorphic operation.

The in-memory processing device 100 may include a memory cell group 110 including memory cells $R_1$, $R_2$, $R_3$, ..., $R_m$, a resistor R, a voltage controlled delay line (VCDL) 130, and a time-digital converter (TDC) 140.

FIG. 4 shows, for convenience of description, one column line 120 among column lines and row lines corresponding to a portion of the memory cell array provided in the in-memory processing device 100. Accordingly, the memory cell array of the in-memory processing device 100 may include a memory cell group 110 for each of the column lines of the memory cell array, and each memory cell group 110 may include memory cells arranged at positions where the corresponding column line intersects with the row lines.

As described above, memory cells of the memory cell group 110 may be implemented as a memristor or a resistive memory device, and may be a device having a variable resistance. Voltage may be applied to the memory cells of the memory cell group 110 through each row line in response to input signals $b_1$, $b_2$, $b_3$, ..., $b_m$ (e.g., where each of the input signals $b_1$, $b_2$, $b_3$, ..., $b_m$ may correspond to a respective row line). For example, to the memory cells of the memory cell group 110, input voltage signals, which are input signals, may be directly applied, or supply voltages may be applied by the input signals.

One end of each of the memory cells $R_1$, $R_2$, $R_3$, ..., $R_m$ of the memory cell group 110 may be configured to receive a voltage through a switch group 101 including switches $SW_1$, $SW_2$, $SW_3$, ..., $SW_m$, and the other end of each of the memory cells of the memory cell group 110 may be connected to a resistor R and a voltage controlled delay line 130. That is, to each column line 120 including the memory cell group 110, the resistor R and the voltage controlled delay line 130 may be connected.

According to a resistance value of each of the memory cells of the memory cell group 110 and a voltage value of an input signal applied to each of the memory cells of the memory cell group 110, a current having a current value calculated based on Ohm's law may flow through the column line 120. Accordingly, the current sum Io of the column currents flowing through the column line 120 may correspond to a result value of a MAC operation between the memory cells of the memory cell group 110 and input signals corresponding to each other.

The input signals ($b_1$, $b_2$, $b_3$, ..., $b_m$) may be respectively applied to the memory cell of the memory cell group 110 in response to a start signal START. To this end, the in-memory processing device 100 may include the switch group 101 including switches $SW_1$, $SW_2$, $SW_3$, ..., $SW_m$ that are switched by the start signal START. Ends of the switches $SW_1$, $SW_2$, $SW_3$, ..., $SW_m$ of the switch group 101 may be connected to ends of the memory cells $R_1$, $R_2$, $R_3$, ..., $R_m$ of the memory cell group 110, respectively. For example, the switch $SW_1$ may be connected to one end of a memory cell $R_1$, the switch $SW_2$ may be connected to one end of a memory cell $R_2$, the switch $SW_3$ may be connected to one end of a memory cell $R_3$, ..., and the switch $SW_m$ may be connected to one end of a memory cell $R_m$. Here, m is a natural number greater than or equal to 1. The other ends of the switches of the switch group 101 may be connected to the input signals $b_1$, $b_2$, $b_3$, ..., $b_m$, respectively.

Meanwhile, the start signal START may be simultaneously input to the voltage controlled delay line 130 and the time-digital converter 140. Alternatively, signals synchronized with the start signal START may be input to the voltage controlled delay line 130 and the time-digital converter 140.

In an example, an input signal may not always be applied to a respective memory cell of the memory cell group 110 in response to the start signal START, according to an input signal value of the input signal (i.e., input voltage value). For example, the input signal may not be applied when the input voltage of the input signal is 0, but is not limited thereto and, in another example, the input signal may not be applied when the input voltage is a specific voltage value (e.g., when the input voltage is equal to or below a predetermined threshold).

The input signals may correspond to individual bit values of an input bit sequence composed of a series of binary values. Specifically, in the in-memory processing device 100, each of the row lines may correspond to each bit position of the input bit sequence. When a bit value of a certain bit position is 1, an input signal having a voltage value corresponding to the bit value 1 may be applied to the row line corresponding to the certain bit position. Further, when a bit value of a certain bit position is 0, an input signal having a voltage value (for example, 0 V voltage) corresponding to the bit value 0 may be applied to the row line corresponding to the certain bit position.

The resistance value of each of the memory cells of the memory cell group 110 may have a bit value (for example, weight or synaptic weight) that is multiplied by each bit of the input bit sequence. Because the memory cells of the memory cell group 110 may be implemented as a resistive memory device having a variable resistance, a memory cell corresponding to the bit value 1 of the memory cells of the memory cell group 110 may have a first resistance value, and a memory cell corresponding to the bit value 0 of the memory cells of the memory cell group 110 may have a second resistance value. However, the memory cells of the memory cell group 110 are not limited thereto and may be implemented as a circuit in which a resistor corresponding to a corresponding bit value is selected from among a plurality of resistors having different resistance values by using a switching element.

Meanwhile, in the present embodiment, while the bit value may be 1 or 0, the bit value is not limited thereto, and may be 1 or −1, other binary bit values, ternary bit values, or the like.

The resistor R may be connected to the column line 120 to which the memory cells $R_1, R_2, R_3, \ldots, R_m$ of the memory cell group 110 are connected, and a voltage $V_o$ corresponding to the current sum $I_o$ of the column currents flowing through the column line 120 may be applied to the resistor R. Accordingly, in the in-memory processing device 100, the resistor R may constitute a sampling circuit for sampling a sampling voltage $V_o$ corresponding to the current sum 10 of the column line 120.

The sampling voltage $V_o$ is a voltage corresponding to the current sum $I_o$ of the column line 120 connected to the resistor R, and may be a MAC operation result between the resistance values of the memory cells of the memory cell group 110 and the applied input signals.

In this case, the value of the sampling voltage $V_o$ may be determined based on the composite resistance of the resistance value of the memory cells of the memory cell group 110 and the resistance value of the sampling resistor R. For example, the sampling resistor R may be connected in series to each column line 120, and the value of the sampling voltage $V_o$ applied to the sampling resistor R may be determined by a ratio of the resistance value of the memory cells connected to the column line 120 to the value of the sampling resistor R.

The voltage controlled delay line 130 or the voltage controlled delay circuit may be a logic circuit using propagation delay characteristics, and may output the stop signal STOP after a preset delay time has elapsed after receiving a start signal START.

The sampling voltage $V_o$ may be input to the voltage controlled delay line 130. The voltage controlled delay line 130 may control a length of the delay time based on the magnitude of the voltage value of the sampling voltage $V_o$. For example, the length of the delay time may be determined in proportion to the sampling voltage $V_o$.

The voltage controlled delay line 130 may be connected to the column line 120 containing each of the memory cells of the memory cell group 110. The voltage controlled delay line 130 may be connected to the sampling circuit of each column line 120. As a result, the voltage controlled delay line 130 may receive the sampling voltage $V_o$ applied to the sampling circuit. That is, the sampling resistor R may sample the sampling voltage $V_o$ corresponding to the result of the MAC operation, and the sampling voltage $V_o$ may be applied to the voltage controlled delay line 130 connected to the sampling resistor R. For example, the voltage controlled delay line 130 may be connected in parallel to the sampling resistor R to receive the sampling voltage $V_o$ as it is.

Non-limiting examples of the voltage controlled delay line 130 will be further described later in more detail with reference to FIGS. 6 and 7.

When receiving the start signal START, the time-digital converter 140 may reset a counter and restart counting for the number of pulses.

Thereafter, when receiving the stop signal STOP from the voltage controlled delay line 130, the time-digital converter 140 outputs a counting value $T_{out}$ as a digital value at the time point when the stop signal STOP is received.

Meanwhile, the memory cells of the memory cell group 110, the resistor R, the voltage controlled delay line 130, and the time-digital converter 140 shown in FIG. 4 may correspond to one output line (i.e., one column line) on the memory cell array in the in-memory processing device 100.

However, as described above, a plurality of output lines (i.e., column lines) may be provided in the memory cell array, and in an example, there may be a respective memory cell group 110, resistor R, voltage controlled delay line 130, and time-digital converter 140 corresponding to each output line.

Figure 5:
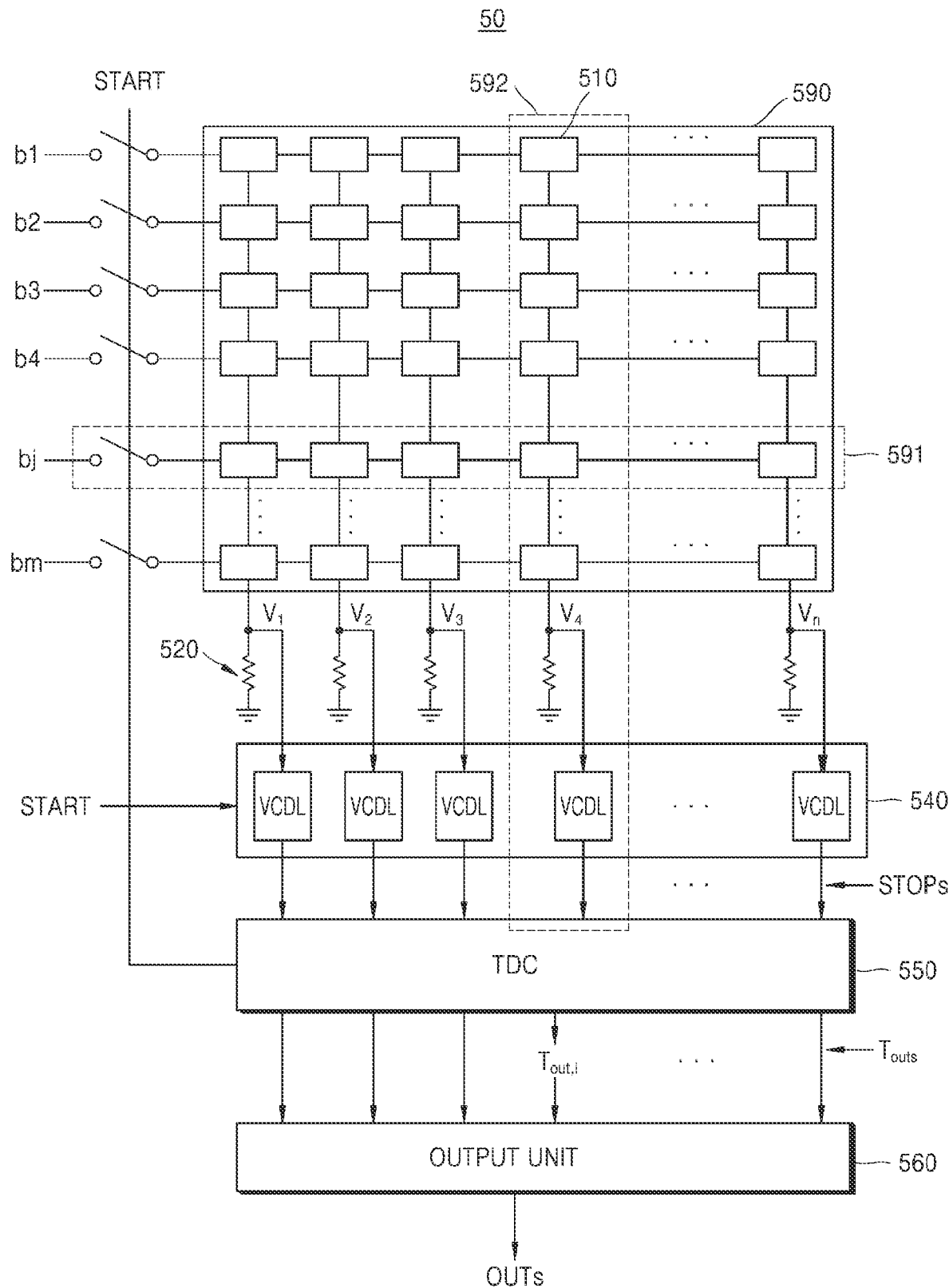
FIG. 5 illustrates an example of an in-memory processing device.

FIG. 5 illustrates an example of an in-memory processing device (e.g., an in-memory processing device 50).

Previously, with respect to FIG. 4, the input lines (row lines) and one output line (column line 120) in the in-memory processing device 120 have been described, but hereinafter, with reference to FIG. 5, an in-memory processing device 50 that includes a memory cell array 590 including input lines (row lines) and multiple output lines (column lines) will be described.

The memory cell array 590 in the in-memory processing device 50 may include input lines (row lines) configured to receive an input signal and output lines (column lines) that individually output an output signal. Each of the input lines (row lines) may intersect with the output lines (column lines). Although, in FIG. 5, it is shown that the input line (row line) and the output line (column line) intersect with each other perpendicularly, the present invention is not limited thereto.

Each of input signals ($b_1, b_2, b_3, b_4, \ldots, b_j, \ldots, b_m$) and a corresponding switch that switches the application of the input signal according to the start signal START are connected to a respective input line (row line). The input signals ($b_1, b_2, b_3, b_4, \ldots, b_j, \ldots, b_m$) may correspond to input voltages or input currents representing binary values, but are not limited thereto. For example, an input signal indicating bit value 1 may represent an arbitrary voltage, and an input signal indicating bit value 0 may represent a floating voltage.

Memory cell groups 510 are provided in the memory cell array, and each of the memory cell group 510 includes memory cells provided at positions where the input lines (row lines) intersect with the corresponding output line (column line).

Each of the memory cells of the memory cell group 510 may be configured to receive an input signal (input voltage) through an input line (row line) in which the corresponding memory cell is arranged among the input lines (row lines). For example, memory cells arranged along a j-th input line 591 may be configured to receive a j-th input signal $b_j$ in response to the start signal START.

According to an embodiment, the in-memory processing device 50 may include a read/write (R/W) driver connected to the memory cell array. The R/W driver may control inputs of input signals ($b_1, b_2, b_3, \ldots, b_m$) by controlling operations of the switches connected to the memory cell array 590.

In addition, the R/W driver may input the start signal START to the voltage controlled delay line 540 and the time-digital converter 550. The time point at which the start signal START is input to the voltage controlled delay line 540 may be synchronized and coincide with the time point at which the start signal START is input to the time-digital converter 550.

In an example, the time point at which the input signals ($b_1, b_2, b_3, \ldots, b_m$) are input to the memory cell array 590 may be synchronized and coincide with the time point at which the start signal START is input to the voltage controlled delay line 540 and the time-digital converter 550.

In another example, the time point at which the input signals ($b_1, b_2, b_3, \ldots, b_m$) are input to the memory cell array 590 and the time point at which the start signal START is input to the voltage controlled delay line 540 and the time-digital converter 550 may be different from each other. For example, the time point at which the input signals are input to the memory cell array 590 may be earlier than the time point at which the start signal START is input to the voltage controlled delay line 540 and the time-digital converter 550.

For example, a switch for controlling the current state may be arranged at a position between an end of a column line of the memory cell array 590 and the voltage controlled delay line 540. In this case, the R/W driver may control the time point at which a sampling voltage $V_n$ is input to the voltage controlled delay line 540 by controlling the operation of the switch. Accordingly, the time point at which the sampling voltage $V_n$ is input to the voltage controlled delay line 540 and the time point at which the start signal START is input to the voltage controlled delay line 540 may be different from each other.

The in-memory processing device 50 may include resistors 520 (e.g., sampling resistors) and voltage controlled delay lines 540 connected to ends of the output lines (column lines), a time-digital converter 550 and an output unit 560.

The resistors 520 may be individually arranged for each output line (column line), and one resistor connected to a certain output line (column line) may constitute a sampling circuit that charges the sampling voltage $V_n$ corresponding to the current sum of the certain corresponding output line (column line).

The resistors 520 connected to the output lines (column lines) may constitute a sampling circuit and may have the same resistance values. Thus, the difference in time constant between the resistors 520 may depend on a difference in composite resistance values of the output lines (column lines), that is, a difference in the current sums of the output lines (column lines).

The voltage controlled delay lines 540 may receive the start signal START. The voltage controlled delay lines 540 may be individually arranged for each output line (column line). Each of the voltage controlled delay lines 540 may determine a delay time based on the magnitude of the sampling voltage $V_n$ of the corresponding output line (column line). Each of the voltage controlled delay lines 540 may output the stop signal STOP to the time-digital converter 550 at a time point delayed by a delay time from the time point at which the start signal START is received.

The time-digital converter 550 may receive the start signal START, reset a counter, and count pulses. When a stop signal STOP is received from one of the voltage controlled delay lines 540, the time-digital converter 550 may perform time-digital conversion at a time point when the stop signal STOP is received.

Specifically, the time-digital converter 550 may receive the stop signal STOP from each of the voltage controlled delay lines 540 connected to each of the output lines (column lines). When a stop signal STOP among the stop signals is received, the time-digital converter 550 may latch a counting value of a counting pulse at a time point when the stop signal STOP is received.

For example, a voltage controlled delay line corresponding to an i-th output line (i-th column line) 592 among the voltage controlled delay lines 540 may output a stop signal $STOP_i$ to the time-digital converter 550 after a delay time has elapsed. When the stop signal $STOP_i$ is received, the time-digital converter 550 may latch a counting value ($T_{out, i}$) of a counting pulse at a time point when the stop signal STOP is received.

The output unit 560 may output a counting value for the certain output line (column line) output from the time-digital converter 550 as a digital value OUT. Here, the output digital value OUT is a value derived from the sampling voltage $V_n$, and eventually corresponds to the result of the MAC operation of the corresponding output line (column line).

Figure 6:
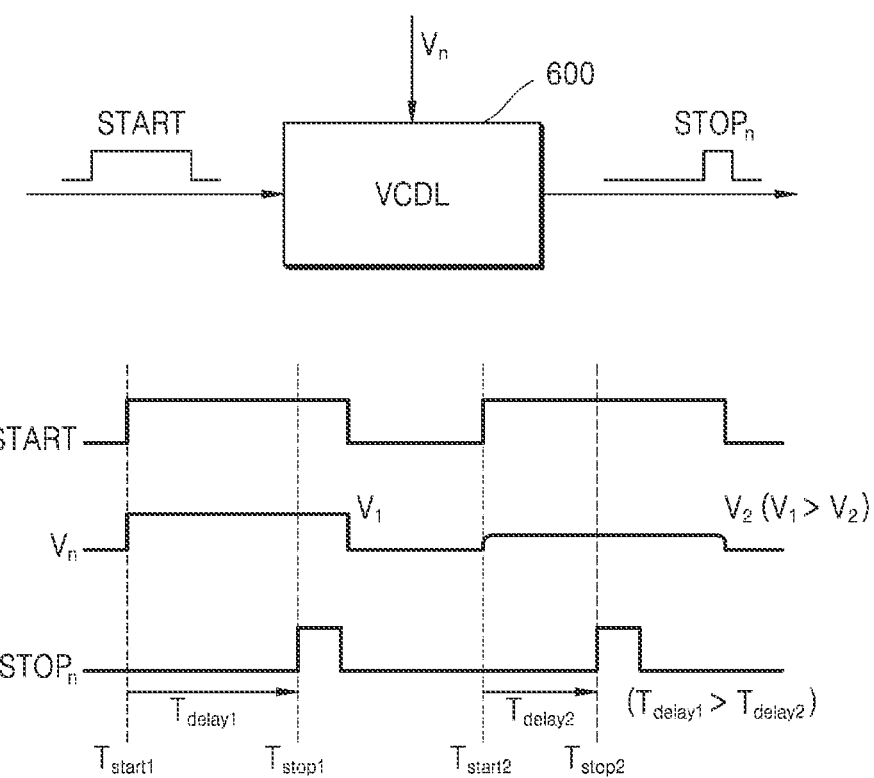
FIG. 6 illustrates an example of an operation of a voltage controlled delay line in an in-memory processing device.

FIG. 6 illustrates an example of an operation of a voltage controlled delay line (e.g., a voltage controlled delay line 600) in an in-memory processing device.

Referring FIG. 6, the voltage controlled delay line 600 may generate a stop signal $STOP_n$ delayed compared to the start signal START by a delay time determined according to the sampling voltage $V_n$. For example, the voltage controlled delay line 600, after receiving the start signal START at a first start time point $T_{start1}$, may output a stop signal $STOP_n$ at a first stop time point $T_{stop1}$ which is delayed by a first delay time $T_{delay1}$ determined by a first sampling voltage $V_1$.

The voltage controlled delay line 600, after receiving the start signal START at a second start time point $T_{start2}$, may output a stop signal $STOP_n$ at a second stop time point $T_{stop2}$ which is delayed by a second delay time $T_{delay2}$ determined by a second sampling voltage $V_2$.

In this case, as the first sampling voltage $V_1$ having a magnitude larger than the second sampling voltage $V_2$ is input, the first delay time $T_{delay1}$ may be set longer than the second delay time $T_{delay2}$. For example, a length of a delay time may be determined to be in proportion to a respective sampling voltage.

The delay time may be adjusted according to a design of the voltage controlled delay line 600. The delay time of the voltage controlled delay line 600 may be set considering the circuit of the in-memory processing device, and may be experimentally selected as an optimal value (e.g., while also proportional to the respective sampling voltage).

Figure 7:
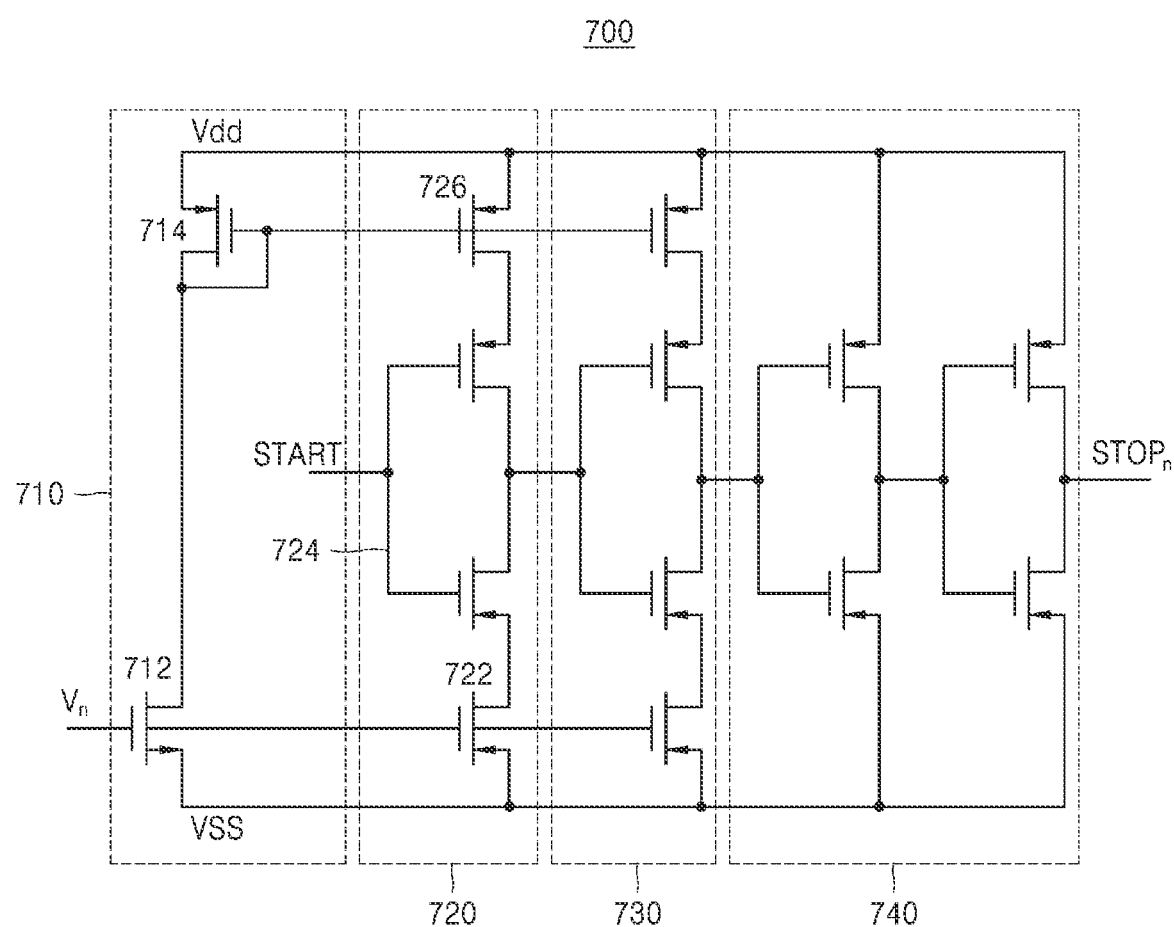
FIG. 7 illustrates an example of an operation of a voltage controlled delay line in an in-memory processing device.

FIG. 7 illustrates an example of an operation of a voltage controlled delay line (e.g., a voltage controlled delay line 700) in an in-memory processing device.

Referring to FIG. 7, the voltage controlled delay line 700 or a voltage controlled delay circuit may receive the sampling voltage $V_n$.

The voltage controlled delay line 700 may control, based on the magnitude of the voltage value of the sampling voltage $V_n$, the length of a delay time from the time point when the start signal START is input to the time point when the stop signal $STOP_n$ is output. For example, as the sampling voltage Vn increases, the delay time may increase. Alternatively, according to a design of the voltage controlled delay line, the delay time may decrease as the sampling voltage $V_n$ increases.

A conventional inverter may also have a delay time from receiving an input signal to generating an output signal. However, because the delay time of the conventional inverter has a nonlinear relationship with the voltage applied to the conventional inverter, the conventional inverter may not precisely control the delay time. In contrast, the voltage controlled delay line 700 of one or more embodiments may precisely control the delay time because the relationship between the sampling voltage and the delay time tends to be linear.

A logic circuit shown in FIG. 7 may be a current-starved type voltage controlled delay line, and may be an embodiment of a voltage controlled delay line.

The voltage controlled delay line 700 may include a bias circuit 710, at least one delay element circuit 720 and 730, a buffer circuit 740, etc. According to one or more embodiments, the voltage controlled delay line 700 may further include another inverter connected in parallel to the delay element circuit or a symmetric load connected to the delay element circuit.

The bias circuit 710 may apply the sampling voltage $V_n$ to a transistor 722 of the delay element circuit 720 through a transistor 712 connected to each column line of the memory cell array. According to a design, the transistor 712 and a transistor 714 may be arranged in the form of a current mirror.

The delay element circuit 720 may include an inverter 724 and transistors 722 and 726. The transistors 722 and 726 may receive the sampling voltage $V_n$ from the bias circuit 710. The inverter 724 may receive the start signal START.

The transistor 712 may act as a current sink, and the transistor 726 may act as a current source, thereby limiting a peak current of the inverter 724. In other words, the inverter 724 may be current-starved.

An output signal of inverter 724 may be input to the buffer circuit 740, and the buffer circuit 740 may output the stop signal $STOP_n$.

According to embodiments, the delay element circuit 720 and the delay element circuit 730 may include a plurality of delay element circuits, respectively, and may be arranged in cascade. The amplification ratios between the transistors 712 and 714 of the bias circuit 710 and the transistors 722 and 726 of the delay element circuit 720 may be designed differently.

The delay time may be adjusted according to a configuration of the voltage controlled delay line 700. The delay time of the voltage controlled delay line 700 may be set considering the circuit of the in-memory processing device, and may be experimentally selected as an optimal value. For example, according to the number of layers of delay element circuits 720 and 730 arranged in cascade within the voltage controlled delay line 700 and amplification ratios between transistors, the length of the delay time that occurred by the same voltage value may be adjusted.

According to embodiments, the voltage controlled delay line may include other types of circuits using propagation delay characteristics. For example, the voltage controlled delay line may include a logic circuit including a shunt capacitor. The voltage controlled delay line using the shunt capacitor may include a capacitive loaded inverter and transistors that control charging and discharging of a load capacitor by acting as linear resistors.

The voltage controlled delay line 700 may be simple logic circuit that does not require a comparator or the like. Accordingly, there is an advantage of minimizing power consumption and occupied area.

Figure 8:
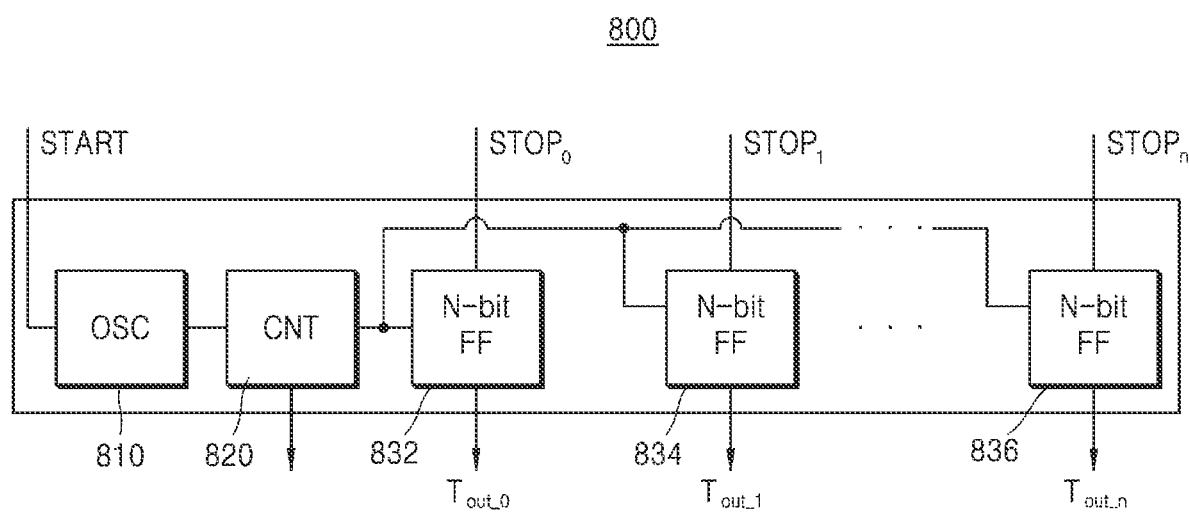
FIG. 8 illustrates an example of time-digital conversion performed in an in-memory processing device.

FIG. 8 illustrates an example of time-digital conversion performed in an in-memory processing device.

Referring to FIG. 8, a time-digital converter 800 may include an oscillator 810, a counter 820, and flip-flops 832, 834, and 836.

The time-digital converter 800 may receive the start signal START. As or when the time-digital converter 800 receives the start signal START, the oscillator 810 may generate a counting pulse, and the counter 820 may restart counting for the counting pulse generated by the oscillator 810 after being reset. Accordingly, when the start signal START is input to the memory cell array, the counter 820 may be synchronized with the input start signal START and may start counting the counting pulse.

The time-digital converter 800 may receive the stop signal $STOP_n$ from the voltage controlled delay line. The flip-flops 832, 834, and 836 may be connected to each of the voltage controlled delay lines.

The flip-flops 832, 834, and 836 may be enabled by a counting pulse received from the counter 820.

When the stop signal $STOP_n$ is received from each voltage controlled delay line while the counting pulse is being applied, each of the respective flip-flops 832, 834, and 836 latches the current counting value $T_{out\_n}$ at the time point at which the stop signal $STOP_n$ is received.

As described above, each of the flip-flops 832, 834, and 836 provided in the time-digital converter 800 may perform the time-digital conversion for each of the column lines (output lines) by individually outputting a counting value $T_{out\_n}$ corresponding to the time point at which the stop signal $STOP_n$ is received.

FIGS. 9A to 9F illustrate examples of signals output from respective components as a start signal is input to an in-memory processing device.

Figure 9A:
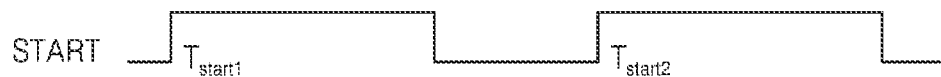
FIGS. 9A to 9F illustrate examples of signals output from respective components as a start signal is input to an in-memory processing device.

FIG. 9A is a diagram regarding a start signal START applied to an in-memory processing device. The start signal START may initiate the MAC operation of the memory cell array. Also, the start signal START may be input to the voltage controlled delay line (and/or the time-digital converter).

Figure 9B:

FIG. 9B is a diagram regarding a signal of a sampling voltage $V_n$. The sampling voltage $V_n$ may be applied to the sampling resistor connected to the end of each column line through a MAC operation after the input signal is input to the memory cell array by the start signal START. Also, the signal of the sampling voltage $V_n$ may be input to the voltage controlled delay line.

For example, according to the result of the MAC operation, the magnitude of the second sampling voltage $V_2$ generated after an input time point of the second start signal $T_{start2}$ may be less than the magnitude of the first sampling voltage $V_1$ generated after an input time point of the first start signal $T_{start1}$.

Figure 9C:
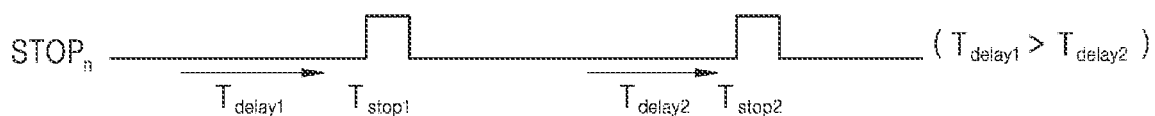

FIG. 9C is a diagram regarding a stop signal $STOP_n$. The stop signal $STOP_n$ may be output at the time points $T_{stop1}$ and $T_{stop2}$ delayed by a delay time $T_{delay1}$ and $T_{delay2}$ from the time point $T_{start1}$ and $T_{start2}$ when the start signal START is input to the voltage controlled delay line. In this case, the delay times may be determined based on the magnitude of the sampling voltage.

For example, the second delay time $T_{delay2}$ delayed according to the second sampling voltage $V_2$ may be less than the first delay time $T_{delay1}$ delayed according to the first sampling voltage $V_1$.

Figure 9D:

FIG. 9D is a diagram regarding a counting pulse generated by an oscillator of a time-digital converter (TDC). When the start signal START is applied, the oscillator may generate a counting pulse.

Figure 9E:
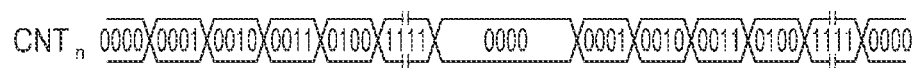

FIG. 9E is a diagram regarding counting for counting pulses by a counter of a TDC. When the start signal is applied, the counter may reset the counting value and restart counting.

Figure 9F:
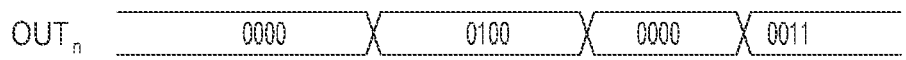

FIG. 9F is a diagram regarding an output value of a flip-flop of the TDC. The flip-flop may output a counting value $OUT_n$ at the time point when the stop signal $STOP_n$ is received from each voltage controlled delay line. For example, the flip-flop may output 0100 as a result of the MAC operation according to the first start signal, and the flip-flop may output 0011 as a result of the MAC operation according to the second start signal.

The processing circuit in the in-memory processing device may perform the MAC operation for each column line (output line) through time-digital conversion as described above. In the in-memory processing device according to the present embodiments, compared to a Von Neumann structure in which a memory and an operation unit are separated, data transfer speed and power consumption may be improved. In addition, because the in-memory processing device does not need to have analog-to-digital converters (ADCs) for individual column lines, power consumption and an occupied area in a circuit may be reduced compared to an architecture equipped with ADCs.

Meanwhile, in the above embodiments, while the voltage value of the input signal and the resistance value of the memory cell may be binary values each composed of a value corresponding to ON (or logic "1") and a value corresponding to OFF (or logic "0"), the present embodiments are not limited thereto. The voltage value of the input signal and the resistance value of the memory cell may have values distinguished by multi-states. For example, when a value of 2 bits is input to one input line (row line), the input signal (input voltage) may be floated for "00", a first voltage value may be allocated as an input signal for "01", a second voltage value greater than the first voltage value may be allocated as input signal for "10", and a third voltage value greater than the second voltage value may be allocated as input signal for "11". In addition, when the memory cell indicates a value of 2 bits, a first resistance value, a second resistance value greater than the first resistance value, a third resistance value, and a fourth resistance value may be allocated to the memory cell for "00", "01", "10", and "11", respectively. The input signal received by each input line (row line) and each memory cell are not limited to indicating a 2-bit multi-state, but may indicate a multi-state corresponding to more bits. Alternatively, values according to systems other than the binary system may be allocated.

Figure 10:
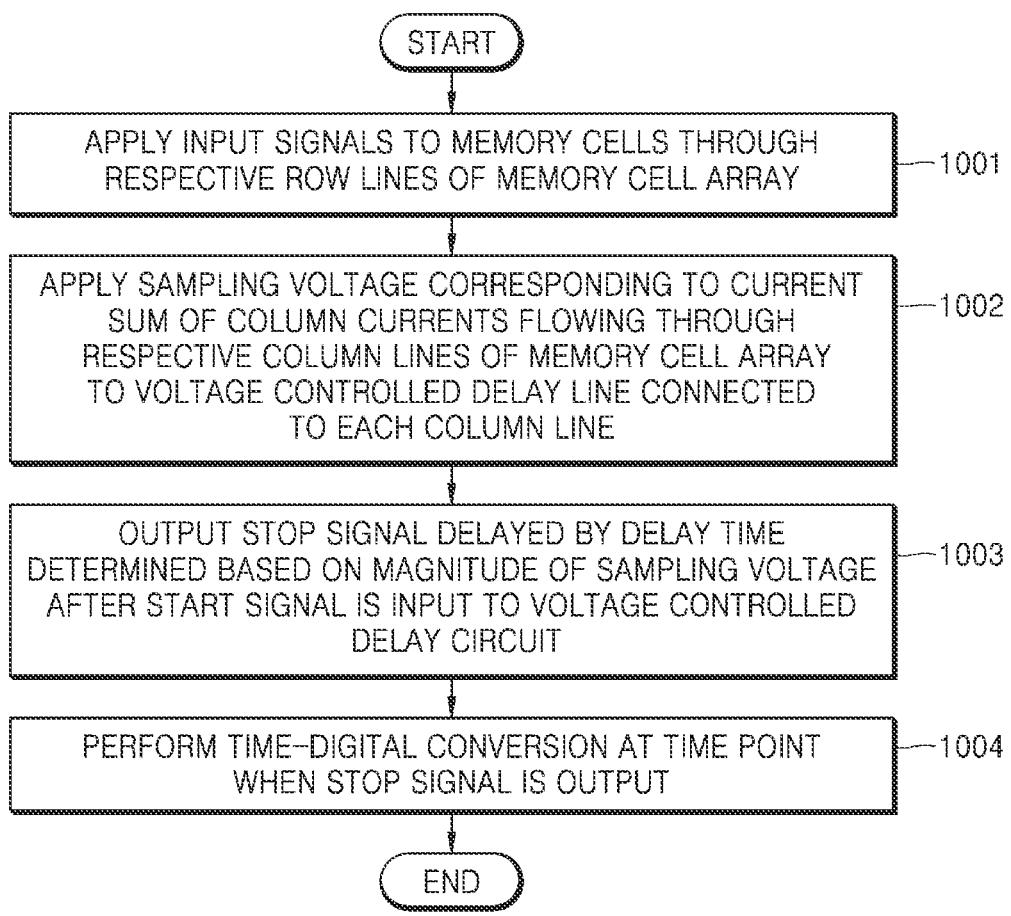
FIG. 10 illustrates an example of a method of performing in-memory processing.

FIG. 10 illustrates an example of a method of performing in-memory processing. Because the method of performing the in-memory processing regarding FIG. 10 relates to the embodiments described with reference to the drawings described above, descriptions given with reference to the drawings described above may be applied to the method in FIG. 10 even though such repeated description is omitted below.

In operation 1001, according to application of the start signal START, an input signal may be applied to memory cells through each row line of the memory cell array. Also, the start signal START may be input to the voltage controlled delay line. In addition, when the start signal START is applied, the counter of the TDC may be reset.

In operation 1002, a sampling voltage corresponding to the current sum of column currents flowing through each column line of the memory cell array may be applied to the voltage controlled delay line connected to each column line.

A sampling resistor may be connected to each column line so that a sampling voltage of the column current is applied. That is, the sampling resistor may sample the sampling voltage corresponding to the result of the MAC operation, and the sampling voltage may be applied to the voltage controlled delay line connected to the sampling resistor.

In operation 1003, after the start signal START is input to the voltage controlled delay circuit, the stop signal $STOP_n$ delayed by a delay time determined based on the magnitude of the sampling voltage may be output.

In operation 1004, the time-digital converter TDC may perform time-digital conversion that is outputting a current counting value of the counting pulse at the time point when the stop signal $STOP_n$ is generated. Accordingly, a counting value corresponding to the result of the MAC operation for the input signal may be output.

Figure 11:
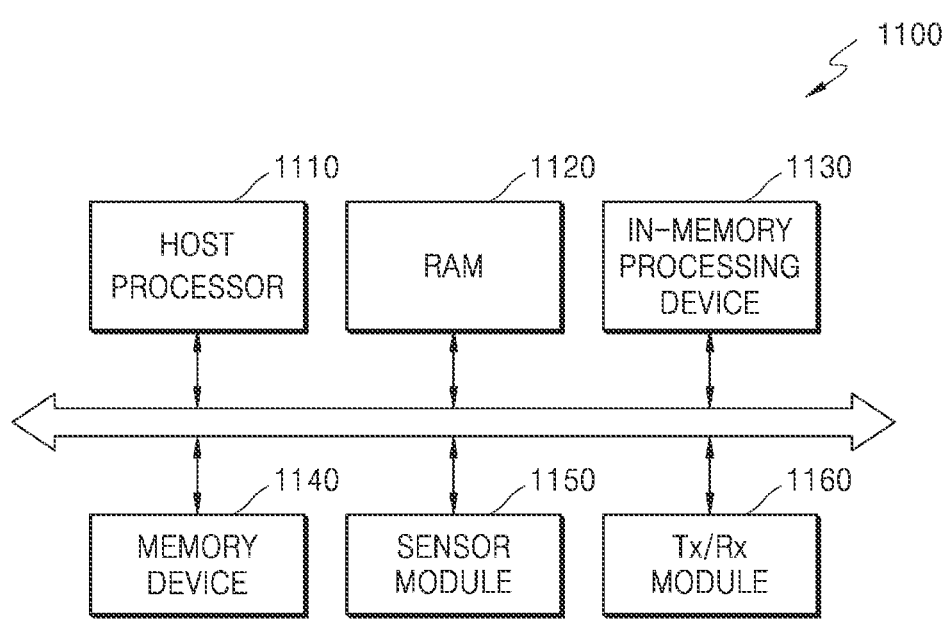
FIG. 11 illustrates an example of a computing apparatus.

FIG. 11 illustrates an example of a computing apparatus (e.g., a computing apparatus 1100).

Referring to FIG. 11, the computing apparatus 1100 may extract valid information by analyzing input data in real time based on a neural network, and based on the extracted information, determine a situation or control components of an electronic device on which the computing apparatus 1100 is mounted. For example, the computing apparatus 1100 may be, or be applied to, a robot device such as a drone and an advanced drivers assistance system (ADAS), a smart TV, a smart phone, a medical device, a mobile device, an image display device, a measurement device, an IoT device, and the like, and may be mounted on at least one of various types of electronic devices.

The computing apparatus 1100 may include a host processor 1110 (e.g., one or more processors), a RAM 1120, an in-memory processing device 1130, a memory device 1140, a sensor module 1150, and a communication module 1160. The computing apparatus 1100 may further include an input/output module, a security module, and a power control device. Some of hardware components of the computing apparatus 1100 may be mounted on at least one semiconductor chip. The in-memory processing device 1130 is an apparatus including the in-memory processing device described with reference to the drawings described above, and may correspond to a neural network dedicated hardware accelerator itself or a neural network apparatus including the same.

The host processor 1110 may control some or all operations of the computing apparatus 1100. The host processor 1110 may include a single processor core or may include multiple processor cores. The host processor 1110 may process or execute programs and/or data stored in the memory device 1140. The host processor 1110 may control functions of the in-memory processing device 1130 by executing programs stored in the memory device 1140. The host processor 1110 may be implemented by a central processing unit (CPU), a graphics processing unit (GPU), or an application processor (AP).

The RAM 1120 may temporarily store programs, data, or instructions. For example, programs and/or data stored in the memory device 1140 may be temporarily stored in the RAM 1120 under the control of the host processor 1110 or boot code. The RAM 1120 may be implemented by a memory such as dynamic RAM (DRAM) or static RAM (SRAM).

The in-memory processing device 1130 may perform the neuromorphic operation described above with respect to the drawings, for example, a MAC operation, and output the result of the MAC operation. However, the in-memory processing device 1130 may also perform various in-memory computing.

The memory device 1140 is a storage location for storing data, and may store an operating system (OS), various programs, and various data. In an embodiment, in the memory device 1140, data (for example, input signal data, weight data, etc.) required for the operation of the in-memory processing device 1130 and operation result data (for example, MAC operation results, etc.) may be stored.

The memory device 1140 may be DRAM, but is not limited thereto. The memory device 1140 may include at least one of a volatile memory and a nonvolatile memory. The nonvolatile memory includes read only memory (ROM), programmable ROM (PROM), erasable programmable ROM (EPROM), electrically erasable programmable ROM (EEPROM), flash memory, phase-change RAM (PRAM), magnet RAM (MRAM), RRAM, ferroelectric RAM (FRAM), and the like. The volatile memory includes DRAM, SRAM, synchronous DRAM (SDRAM), PRAM, MRAM, RRAM, FeRAM, and the like. In an embodiment, the memory device 1140 may include at least one of a hard disk drive (HDD), a solid state drive (SSD), a compact flash (CF) card, a secure digital (SD) card, a micro-SD card, a mini-SD card, an extreme digital (xD) card, or a memory stick.

The sensor module 1150 may collect information around an electronic device on which the computing apparatus 1100 is mounted. The sensor module 1150 may sense or receive a signal (for example, an image signal, an audio signal, a magnetic signal, a bio signal, a touch signal, etc.) from the outside of the electronic device, and convert the sensed or received signal into data. To this end, the sensor module 1150 may include at least one of various types of sensing devices such as a microphone, an imaging device, an image sensor, a light detection and ranging (LIDAR) sensor, an ultrasonic sensor, an infrared sensor, a bio sensor, a touch sensor, etc.

The sensor module 1150 may provide the data obtained from the sensed or received signal to the in-memory processing device 1130 as input data. For example, the sensor module 1150 may include an image sensor, generate a video stream by photographing an external environment of the electronic device, and provide in order a continuous data frame of the video stream to the in-memory processing device 1130 as input data. However, the present invention is not limited thereto, and the sensor module 1150 may provide various types of data to the in-memory processing device 1130.

The communication module 1160 may include various wired or wireless interfaces capable of communicating with external devices. For example, the communication module 1160 may include a communication interface accessible to a wired local area network (LAN), a wireless local area network (WLAN) such as a wireless fidelity (Wi-Fi), a wireless personal area network (WPAN) such as a Bluetooth network, a wireless universal serial bus (USB), ZigBee, near field communication (NFC), radio-frequency Identification (RFID), power line communication (PLC), or a mobile cellular network such as a 3rd generation (3G) network, a 4th generation (4G) network, a long term evolution (LTE) network, and a 5th generation (5G) network.

FIG. 12 illustrates an example of a neural network (e.g., a neural network 1200).

Referring to FIG. 12, the neural network 1200 may correspond to an example of a deep neural network (DNN). For convenience of description, it is illustrated that the neural network 1200 includes two hidden layers, but the neural network may include a variety of hidden layers. In addition, although FIG. 12 shows that the neural network 1200 includes a separate input layer 1210 for receiving input data, the input data may be directly input to the hidden layer.

Artificial nodes of layers other than an output layer in the neural network 1200 may be connected to artificial nodes of a next layer through links for transmitting an output signal. Through the links, an output of an activation function regarding weighted inputs of artificial nodes included in a previous layer may be input to the artificial node. The weighted input is an input (node value) of an artificial node multiplied by a weight, the input corresponds to axon values, and the weight corresponds to synaptic weights. The weight may be referred to as a parameter of the neural network 1200. The activation function may include a sigmoid function, a hyperbolic tangent (tanh) function, and a rectified linear unit (ReLU), and nonlinearity may be formed in the neural network 1200 by the activation function.

The in-memory processing device described above with reference to the drawings may be used for in-memory processing or in-memory computing for driving a deep learning algorithm. For example, the calculation of the weighted input transmitted between the nodes 1221 of the neural network 1200 may be implemented by a MAC operation. The output from any one node 1221 included in the neural network 1200 may be expressed as Equation 1 below.

$$y_i = f\left(\sum_{j=1}^{m} w_{j,i} x_j\right) \qquad \text{Equation 1}$$

Equation 1 may represent an output value $y_i$ of the i-th node 1221 form input values in a certain layer. In Equation 1, $x_j$ may represent the output value of the j-th node of the previous layer, and $w_{j,i}$ may represent the weight applied to the output value of the j-th node and the i-th node 1221 of the current layer. In Equation 1, f ( ) may represent an activation function. As shown in Equation 1, a result obtained by multiplying the input value $x_j$ by the weight $w_{j,i}$ may be used for the activation function. In other words, an operation (MAC operation) of multiplying and adding an appropriate input value $x_j$ and weight $w_{j,i}$ at a desired time point may be repeated. In addition to these uses, there are various application fields requiring MAC operations, and for this purpose, a neuromorphic device capable of processing MAC operations in the analog domain may be used.

In the neural network 1200 composed of one or more layers including a plurality of nodes, the memory cells of the in-memory processing device may have a resistance corresponding to a connection weight of a connection line connecting the nodes. An input signal provided along input lines (row lines) in which memory cells are arranged may represent a value corresponding to a node value $x_j$. Accordingly, the in-memory processing device may perform at least some of the operations required to implement the neural network 1200.

On the other hand, the application of the in-memory processing device is not necessarily limited to neuromorphic operations, but may also be used for operations that require fast processing of multiple input data using analog circuit characteristics with low power.

The two-dimensional array circuits, axon circuit groups, synapse arrays, neuron circuit groups, in-memory processing devices, switch groups, memory cell groups, column lines, voltage controlled delay lines, time-digital converters, resistors, output units, memory cell arrays, input lines, bias circuits, delay element circuits, buffer circuits, oscillators, counters, flip-flops, computing apparatuses, host processors, RAMs, memory devices, sensor modules, communication modules, two-dimensional array circuit 20, axon circuit group 210, synapse array 220, neuron circuit group 230, in-memory processing device 100, switch group 101, memory cell group 110, column line 120, voltage controlled delay line 130, time-digital converter 140, memory cell group 510, resistors 520, voltage controlled delay lines 540, time-digital converter 550, output unit 560, memory cell array 590, input line 591, output line 592, voltage controlled delay line 600, voltage controlled delay line 700, bias circuit 710, delay element circuit 720, delay element circuit 730, buffer circuit 740, time-digital converter 800, oscillator 810, counter 820, flip-flops 832, 834, and 836, computing apparatus 1100, host processor 1110, RAM 1120, in-memory processing device 1130, memory device 1140, sensor module 1150, communication module 1160, and other apparatuses, devices, units, modules, and components described herein with respect to FIGS. 1-12 are implemented by or representative of hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-12 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions used herein, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

What is claimed is:

1. An in-memory processing apparatus, the apparatus comprising:
    a memory cell array comprising memory cell groups configured to generate current sums of column currents flowing through respective column lines in response to input signals input through row lines;
    voltage controlled delay circuits configured to output, in response to an input of a start signal at a first time point, stop signals at second time points delayed by delay times determined based on magnitudes of applied sampling voltages corresponding to the current sums;
    a time-digital converter configured to perform time-digital conversion at the second time points; and
    sampling resistors connected to the column lines,
    wherein the time-digital converter is configured to reset a counter at the first time point, and output counting values as digital values at the second time points.

2. The apparatus of claim 1, wherein the voltage controlled delay circuits are configured to determine the delay times in proportion to the magnitudes of the sampling voltages.

3. The apparatus of claim 1, wherein the voltage controlled delay circuits have current-starved circuitry including transistors to which the sampling voltages are applied and inverters to which the start signal is input.

4. The apparatus of claim 1, wherein the voltage controlled delay circuits include biases connected to the column lines and configured to apply the sampling voltages, current-starved delay elements to which the start signals are input, and buffers configured to output the stop signals.

5. The apparatus of claim 1, wherein the sampling resistors are configured to receive sampling voltages.

6. The apparatus of claim 5, wherein
    the sampling resistors are connected in series to the column lines, and
    the voltage controlled delay circuits are connected in parallel to the sampling resistors.

7. The apparatus of claim 5, wherein values of the sampling voltages are determined based on composite resistances of resistance values of the memory cell groups and resistance values of the sampling resistors.

8. The apparatus of claim 1, further comprising a driver configured to input the input signals to the memory cell array at a third time point synchronized with the first time point.

9. The apparatus of claim 1, wherein the time-digital converter includes an oscillator configured to generate a pulse at the first time point and the counter configured to count the pulse.

10. The apparatus of claim 1, wherein the time-digital converter includes flip-flops configured to latch the counting values at the second time point.

11. An in-memory processing method, the method comprising:
    inputting input signals to memory cell groups through row lines of a memory cell array;
    applying sampling voltages corresponding to current sums of column currents flowing through column lines of the memory cell array to voltage controlled delay circuits connected to the column lines;
    inputting a start signal to the voltage controlled delay circuits at a first time point;
    outputting stop signals at second time points delayed by delay times determined based on magnitudes of the sampling voltages; and
    performing time-digital conversion at the second time points, including
    resetting a counter at the first time point, and
    outputting counting values as digital values at the second time points,
    wherein sampling resistors are connected to the column lines.

12. The method of claim 11, wherein
    the method further comprises determining the sampling voltages based on composite resistances of resistance values of the memory cell groups and resistance values of the sampling resistors.

13. The method of claim 11, further comprising outputting, based on the output counting values, an output digital value corresponding to a MAC operation result of a neural network.

14. An in-memory processing apparatus, the apparatus comprising:
    a memory cell array comprising memory cell groups each corresponding to a respective column line and configured to generate a current sum of column currents flowing through the respective column line in response to input signals applied through row lines;
    voltage controlled delay circuits each corresponding to a respective column line and configured to output, in response to an input of a start signal at a first time point, a stop signal at second time point delayed by a delay time determined based on a magnitude of an applied sampling voltage corresponding to a respective one of the current sums;
    a time-digital converter configured to, based on the stop signals, perform time-digital conversion at the second time points; and
    sampling resistors connected to the column lines,
    wherein the time-digital converter is configured to reset a counter at the first time point, and output counting values as digital values at the second time points.

15. The apparatus of claim 14, wherein the time-digital converter comprises:
    an oscillator configured to generate a counting pulse starting from the first time point, in response to receiving the start signal;
    the counter configured to generate the counting values of the counting pulse in response to the generating of the counting pulse; and
    flip-flops each corresponding to a respective column line and configured to output a counting value of the generated counting values corresponding to a respective second time point, in response to receiving a stop signal of the stop signals from a respective one of the voltage controlled delay circuits.

16. The apparatus of claim 14, wherein a sampling resistor is configured to receive sampling voltage.

* * * * *